(12) United States Patent
Hasegawa et al.

(10) Patent No.: US 8,670,239 B2
(45) Date of Patent: Mar. 11, 2014

(54) HEAT-RELEASE CONFIGURATION, BRACKET FOR SUPPORTING HEAT-RELEASE PLATE AND METHOD OF ASSEMBLING HEAT-RELEASE CONFIGURATION

(75) Inventors: Takahiko Hasegawa, Isehara (JP); Mineyo Takahashi, Minamiashigara (JP)

(73) Assignee: Ricoh Company, Ltd., Tokyo (JP)

( * ) Notice: Subject to any disclaimer, the term of this patent is extended or adjusted under 35 U.S.C. 154(b) by 266 days.

(21) Appl. No.: 12/985,592

(22) Filed: Jan. 6, 2011

(65) Prior Publication Data
US 2011/0164386 A1 Jul. 7, 2011

(30) Foreign Application Priority Data

Jan. 7, 2010 (JP) ................................ 2010-001911
Sep. 24, 2010 (JP) ................................ 2010-213306

(51) Int. Cl.
*H05K 7/20* (2006.01)
(52) U.S. Cl.
USPC ........... 361/717; 361/704; 361/707; 361/719; 257/717; 257/719
(58) Field of Classification Search
None
See application file for complete search history.

(56) References Cited

U.S. PATENT DOCUMENTS

| | | | | | |
|---|---|---|---|---|---|
| 5,450,284 | A | * | 9/1995 | Wekell | 361/710 |
| 6,049,459 | A | * | 4/2000 | Edmonds et al. | 361/707 |
| 6,075,703 | A | * | 6/2000 | Lee | 361/707 |
| 6,128,191 | A | * | 10/2000 | Bell et al. | 361/720 |
| 6,262,893 | B1 | * | 7/2001 | Liu | 361/704 |
| 6,587,344 | B1 | * | 7/2003 | Ross | 361/704 |
| 6,801,432 | B2 | * | 10/2004 | Petricek | 361/704 |
| 7,021,365 | B2 | * | 4/2006 | Rearick et al. | 165/80.3 |
| 7,136,600 | B2 | | 11/2006 | Yamanaka et al. | |
| 7,386,259 | B2 | | 6/2008 | Yamanaka et al. | |
| 7,551,867 | B2 | | 6/2009 | Yamanaka et al. | |
| 7,663,885 | B2 | * | 2/2010 | Ogawa et al. | 361/711 |
| 7,715,196 | B2 | * | 5/2010 | Chen et al. | 361/719 |
| 7,750,252 | B2 | * | 7/2010 | Colby et al. | 174/548 |
| 2009/0154947 | A1 | | 6/2009 | Yamanaka et al. | |
| 2011/0013374 | A1 | * | 1/2011 | Liu | 361/825 |
| 2011/0115495 | A1 | * | 5/2011 | Kunii | 324/543 |

FOREIGN PATENT DOCUMENTS

JP 2571312 2/1998

* cited by examiner

*Primary Examiner* — Boris Chervinsky
(74) *Attorney, Agent, or Firm* — Oblon, Spivak, McClelland, Maier & Neustadt, L.L.P.

(57) ABSTRACT

A heat-release configuration includes a printed board on which a semiconductor component is mounted, a heat-release plate which is mounted on the semiconductor component, and configured to diffuse heat generated by the semiconductor component; and a supporting clamp which is mounted on the heat-release plate, and configured to fix the heat-release plate to the printed board via a hole provided in the printed board, the supporting clamp including a sectional L-shape in a horizontal direction having two flat surfaces substantially orthogonal to each other, the supporting clamp having on a lower side of each of the flat surfaces a leading end portion which is inserted into the hole of the printed board and a locking claw which is formed in the leading end portion and projects outside the L-shape.

8 Claims, 16 Drawing Sheets

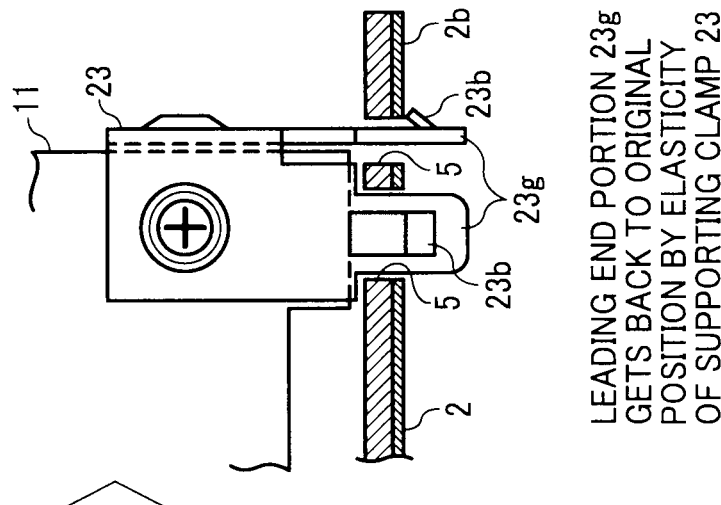
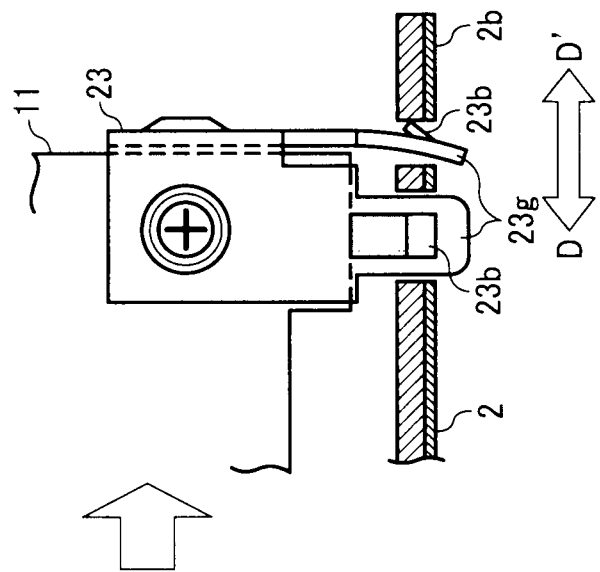
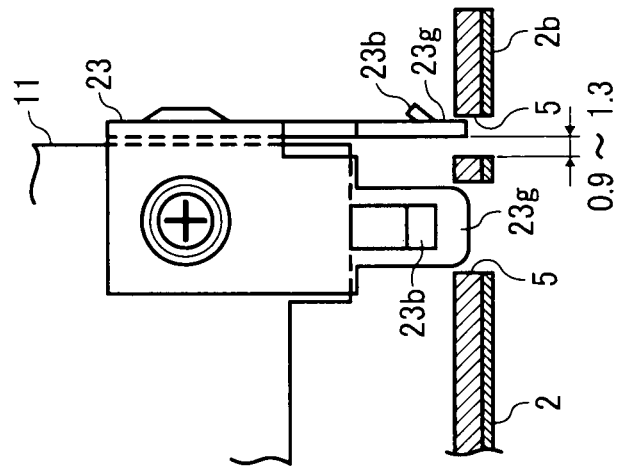

FIG. 8A
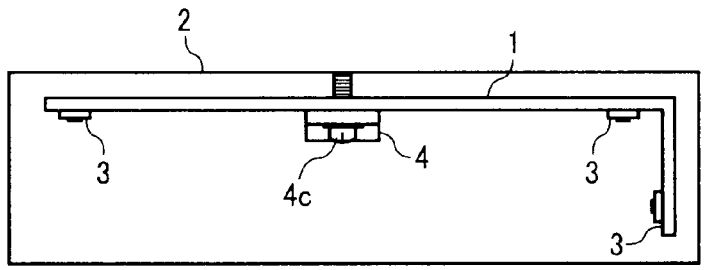
FIG. 8B
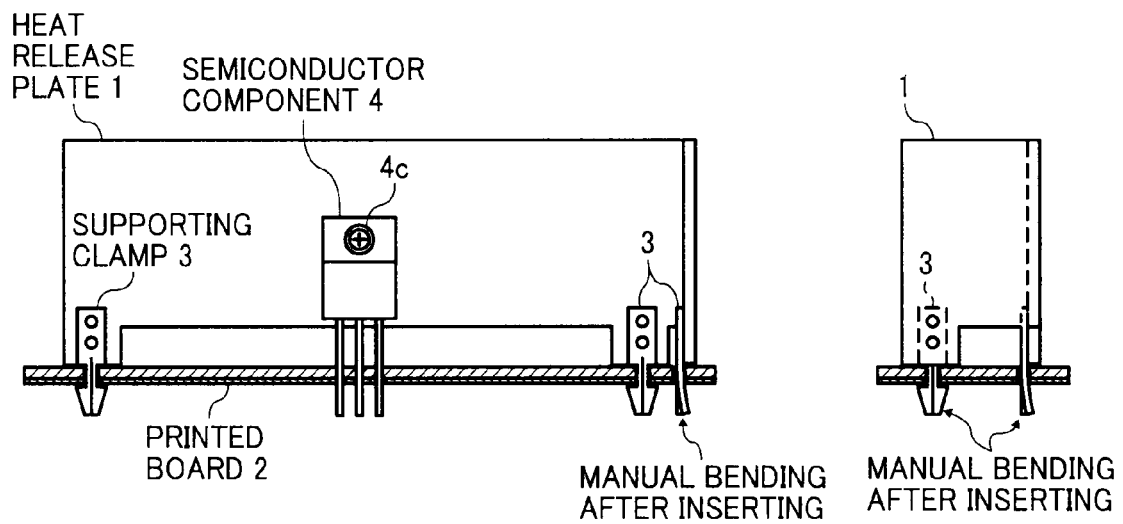
FIG. 8D
FIG. 8C
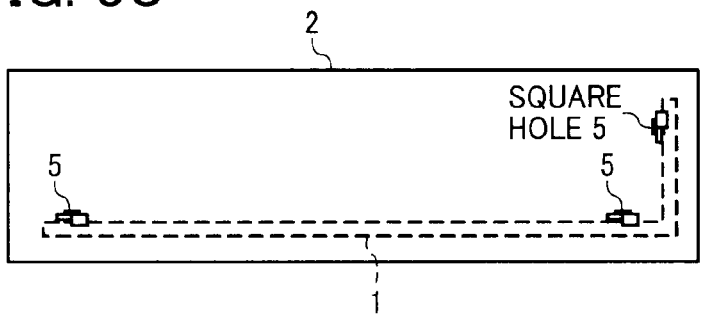

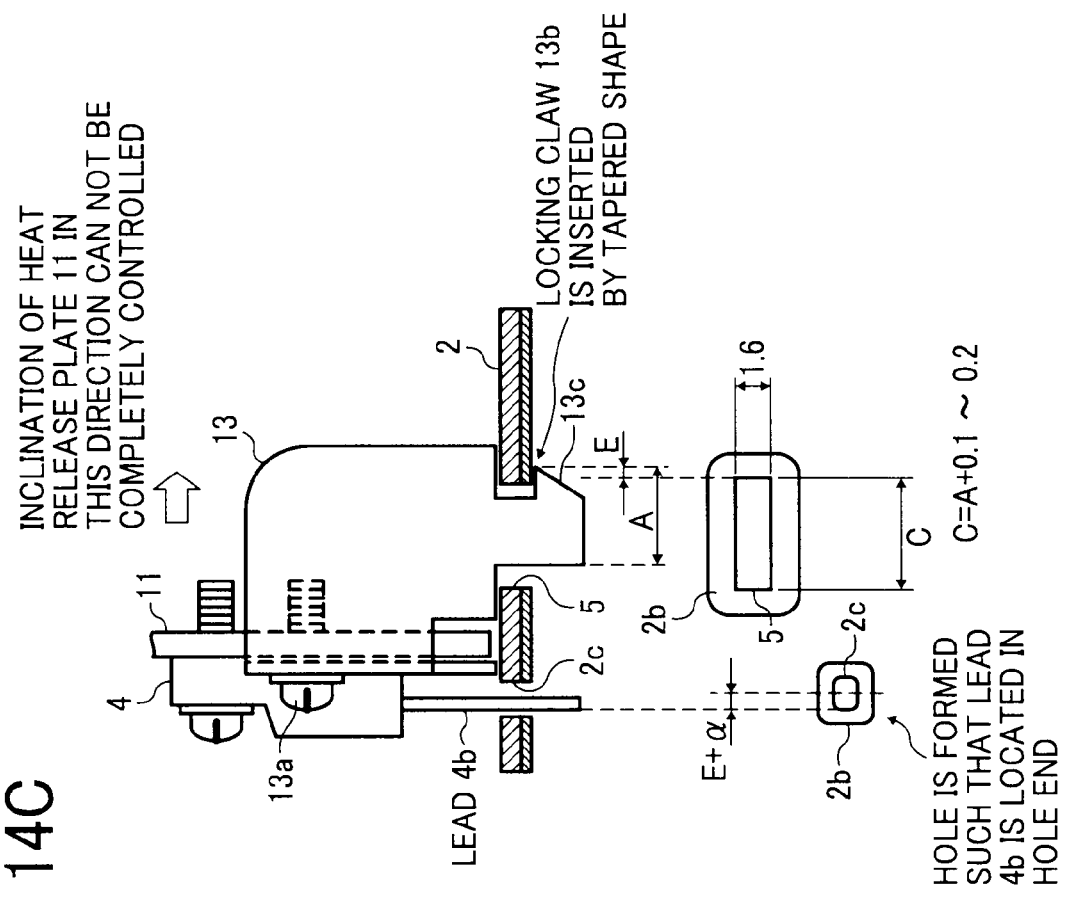
FIG. 14C
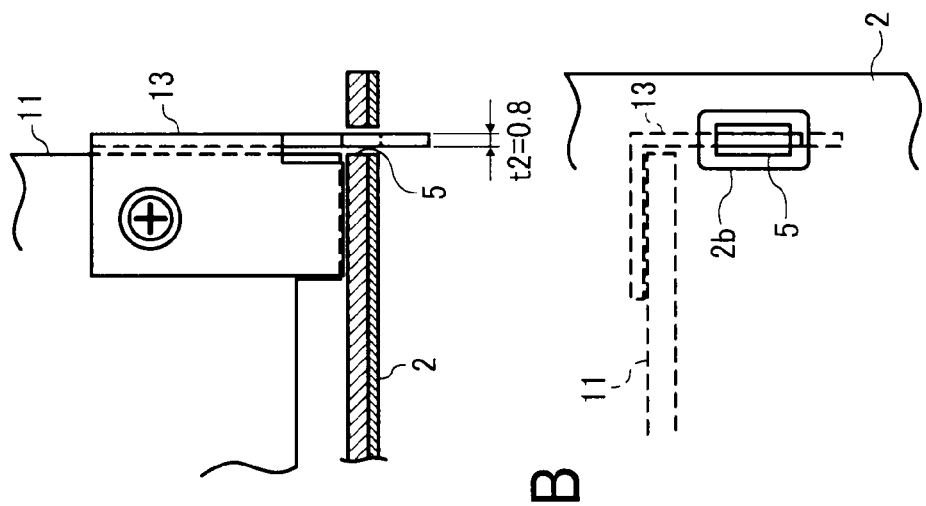
FIG. 14A
FIG. 14B

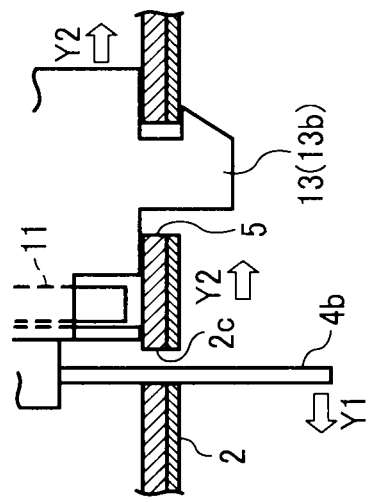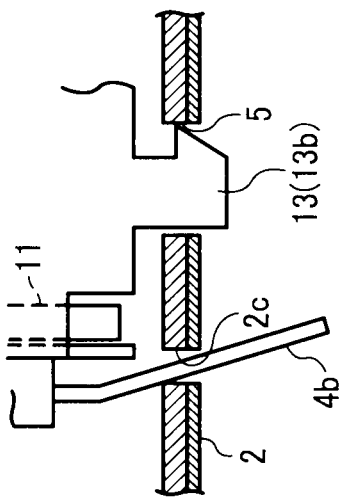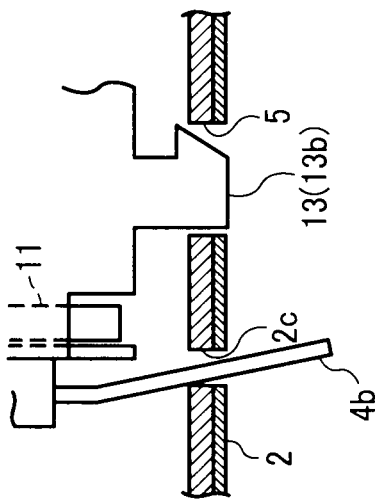

HEAT-RELEASE CONFIGURATION, BRACKET FOR SUPPORTING HEAT-RELEASE PLATE AND METHOD OF ASSEMBLING HEAT-RELEASE CONFIGURATION

PRIORITY CLAIM

The present application is based on and claims priority from Japanese Patent Application No. 2010-001911, filed on Jan. 7, 2010 and Japanese Patent Application No. 2010-213306, field on Sep. 24, 2010, the disclosures of which are hereby incorporated by reference in their entirety.

BACKGROUND OF THE INVENTION

1. Field of the Invention

The present invention relates to a heat-release configuration for use as a countermeasure against heat of a semiconductor component having large heat generation, which is provided in a power source device. In particular, the present invention relates to a heat-release configuration having a clamp for supporting a heat-release plate in a printed board.

2. Description of the Related Art

Conventionally, in an electric component which is provided in a power source device, a heat-release plate made of aluminum, copper, iron or the like is mounted on a semiconductor component having especially large heat generation as a countermeasure against heat. Such a heat-release plate is mounted on a printed board by means of a screw, a rivet, manually bending a supporting clamp or the like.

Hereinafter, several methods of mounting a heat-release plate having a semiconductor component on a printed board will be described.

The first method is a method of mounting a heat-release plate on a solder surface of a printed board by soldering a semiconductor lead after screwing the heat release plate. The heat-release plate is firmly fixed to the printed board by this method. However, in an assembly process of a power source device, after mounting the heat-release plate on the printed board (a state in which the heat-release plate is only inserted into the printed board), the printed board is turned over by using a dedicated jig which fixes the heat-release plate for preventing the falling off of the heat-release plate, so as to turn the solder surface upward, and then the heat-release plate is soldered. In this case, it is necessary for a component attached to the heat-release plate to be manually soldered. For this reason, this first method is an inefficient method.

If a screw having a surface treatment to which solder adheres is used, the electrical connection between the heat-release plate and the printed board is improved. However, such a screw is expensive compared to a screw having a normal surface treatment, resulting in an increase in component costs.

In this case, the assembly process of the power source device is as follows. After an automatically insertable component is mounted on the printed board, a component which requires manual insertion is mounted on the printed board. Then, by dipping (in a solder bath), the component is soldered to the printed board. After that, the printed board is turned over so as to mount the heat-release plate, and then the manual soldering is performed.

The second method is a method of mounting a heat-release plate to a printed board by using a rivet. The heat-release plate is also firmly fixed to the printed board by this method. In this case, the workload of the operation of mounting the heat-release plate and the soldering operation in the assembly process of the power source device is less than that in the above-described soldering method.

However, the second method requires dedicated equipment (rivet machine), requires increased costs for maintaining consumable supplies, and may cause the operation failure of the dedicated equipment by the deterioration in the consumable supplies.

In this case, the assembly process of the power source device is as follows. At first, a component is automatically inserted into the printed board. After that, the heat-release plate is manually mounted on the printed board by using a rivet. Then, a component which requires manual insertion is mounted on the printed board. Then, by dipping (in a solder bath), the heat-release plate and the component are soldered to the printed board.

The third method is a method of mounting a heat-release plate to a printed board by manually bending a projection of the heat-release plate or a projection of a supporting clamp attached to the heat-release plate, which penetrates through the printed board. In this method, the projection which penetrates through the printed board and projects downwardly from the solder surface of the printed board is provided in each of both end portions of the heat-release plate. Or a supporting clamp or the like which penetrates through the printed board and projects downwardly from the solder surface of the printed board is mounted on the heat-release plate. The printed board and the heat-release plate are thereby firmly fixed, and the component can be soldered by dipping (in a solder bath).

However, in this third method, similar to the first method, it is necessary to mount the heat-release plate on the printed board by a dedicated jig (a state in which the heat-release plate is only inserted into the printed board), turn the solder surface of the printed board upward, and manually bend the heat-release plate or the supporting clamp. In addition, in this third method, the manual soldering operation of the heat-release plate is not necessary, and a workload is less than that in the above-described method of mounting the heat-release plate by soldering.

In this case, the assembly process of the power source device is as follows. At first, a component is automatically inserted into the printed board. After that, the heat-release plate or the supporting clamp is inserted into the printed board, the printed board is turned over, the heat-release plate or the supporting clamp is manually bent, and the heat-release plate is fixed to the printed board. Then, a component which requires the manual insertion is mounted on the printed board. By dipping (in a solder bath), the heat-release plate and the component are soldered to the printed board.

The fourth method is a method of mounting a heat-release plate to a printed board by forming the heat-release plate into a crank shape, or forming the supporting clamp provided in each of both ends of the heat-release plate into an L-shape such that the heat-release plate becomes self standable. In this method, the shape of the heat-release plate or the supporting clamp is devised such that the turning over operation of the printed board and the bending operation of the heat-release plate or the supporting clamp in the third method can be omitted.

However, due to the vibration and the like in the conveyor movement in the solder bath, the heat-release plate may be soldered to the printed board in a state in which the heat-release plate is inclined or the heat-release plate does not closely have contact with the printed board. In this case, the heat-release plate is pressed, causing pattern abrasion and a probability of solder cracks occurring by the vibration and impact is increased.

In this case, the assembly process of the power source device is as follows. At first, a component is automatically inserted into the printed board. After that, the heat-release plate is attached to the printed board. Moreover, a component which requires manual insertion is mounted. Then, by dipping (in a solder bath), the heat-release plate and the component are soldered to the printed board.

As described above, conventionally, the heat-release plate is assembled to the printed board of the power source device by the first to fourth methods or the like.

Japanese Utility Model No. 2571312 proposes a method of mounting an electric component on a heat-release plate by using a clip having a strong spring shape without using a screw when the electric component is mounted on the heat-release plate. By this method, a screw hole for mounting the electric component on the heat-release plate becomes unnecessary, a design freedom for disposing the electric component is improved, and the heat-release plate can be commonly used.

Hereinafter, the conventional example which mounts a heat-release plate on a printed board will be described by using a specific example of a heat-release plate assembly component.

FIGS. 8A-8D are views each illustrating a heat-release plate assembly component for use in a printed board of a power source device and a shape of a general heat-release plate and a shape of a supporting clamp. As illustrated in FIGS. 8A-8D, a semiconductor component (an element such as an FET and a diode) having a large heat generation volume is used in the power source device. As a countermeasure against the heat, the printed board 2 includes a heat-release plate 1 made of aluminum, copper, iron or the like. A semiconductor component 4 is screwed to the heat-release plate 1 by a screw 4c. Moreover, the heat-release plate 1 includes two or more supporting clamps 3.

In FIGS. 8A-8D, aluminum having a thickness of about 1-3 mm is introduced as the heat-release plate 1. The heat-release plate 1 has an L-shape to be self standable on the printed board 2 (it can be a U-shape, a Z-shape or the like). The heat-release plate has on one end portion thereof two small cylindrical convex portions 3a up and down and the other end portion thereof which is near the corner (near the corner of the L-shape) has two small cylindrical convex portions 3a up and down. The cylindrical convex portion 3a is used for mounting a supporting clamp as illustrated in FIGS. 9A-9C, and is formed by a half blanking process. These two convex portions 3a are inserted into two holes 3c (refer to FIG. 10A) formed in the supporting clamp 3, respectively. The supporting clamp 3 is thereby mounted on the heat-release plate 1. The convex portions 3a which project from the holes 3c of the supporting clamp 3 are crushed by a pressing process, the holes 3a of the supporting clamp 3 are shielded, and the supporting clamp 3 is firmly fixed to the heat-release plate 1.

The semiconductor component 4 is directly screwed to the semiconductor hole 4a by the screw 4c (pressing clamp or the like), and is mounted on the heat-release plate 1. The heat-release plate 1 to which the supporting clamp 3 and the semiconductor component 4 are assembled is mounted on the printed board 2.

FIGS. 10A, 10B are views each illustrating the shape of the supporting clamp 3 and the shape of a square hole provided in the printed board 2. The supporting clamp 3 is formed by a relatively soft thin material having a thickness of about t1=0.3 mm such as phosphor bronze and bronze, and has a solder plating surface. The supporting clamp 3 has a portion to be inserted into the printed board 2. This portion is divided into two having a fork shape, and the leading end portion of each divided portion has a tapered shape (tapered portion 3f). This portion includes a locking claw 3b which deforms inwardly when it is inserted into the square hole 5 of the printed board 2 and engages with the lower face of the printed board after the deformation.

The shape of the square hole 5 of the printed board 2 into which the insertion portion of the supporting clamp 3 is inserted is, with respect to the leading end portions of the insertion portion of the supporting clamp 3, A (the width of the locking claw 3b)>C (the length of the long side of the rectangular hole 5)>B (the width of the leading end potion of the insertion portion except the locking claw 3b). The rectangular hole 5 on the back face of the printed board 2 includes in the entire circumference thereof a pattern beaten-copper portion 2b. The entire circumference of the leading end portion of the insertion portion of the supporting claim 3 which projects from the back face of the printed board 2 is soldered to the pattern beaten-copper portion 2b of the printed board 2. Thereby, the supporting clamp 3 is fixed to the printed board 2.

FIGS. 11A-11 are views each illustrating change in the shape of the leading end portions of the supporting clamp 3 when the clamp 3 is mounted on the printed board 2. FIG. 11A illustrates a state in which the tapered portions 3f of the leading end portions of the insertion portion of the supporting clamp 3 are inserted until they have contact with the square hole 5 of the printed board 2, and does not illustrate changes in the shape of the leading end portions.

FIG. 11B illustrates a state in which the insertion portion of the supporting clamp 3 is further inserted into the printed board 2, so that the leading end portions of the insertion portion of the supporting clamp 3 are inserted into the square hole 5 of the printed board 2. The leading end portions of the insertion portion of the supporting clamp 3 deform by being pressed to both walls in the square hole 5 of the printed board 2, and the locking claws 3b stay in the square hole 5. The thickness of the supporting clamp 3 is about 0.3 mm, and the supporting clamp 3 is formed by a relatively soft material, so that the leading end portion of the insertion portion of the supporting clamp 3 easily deforms as described above. Therefore, the heat-release plate 1 can be easily and manually inserted without requiring increased strength for inserting the heat-release plate 1 to the printed board 2.

FIG. 11C illustrates a state in which the locking claws 3b of the leading end portions of the insertion portion of the supporting clamp 3 project from the undersurface (solder surface) of the printed board 2. The supporting clamp 3 does not have elasticity in the arrows D and D' directions, so that the leading end portions do not return back to the original positions, respectively. Consequently, the width of the leading end portions becomes less than the width C of the square hole 5 of the printed board 2.

As described above, since the printed board 2 and the supporting clamp 3 are not physically locked, the heat-release plate 1 easily falls by lightly shaking the entire printed board 2 by hand. If the heat-release plate 1 falls by lightly shaking the printed board 2 by hand, the heat-release plate 1 easily inclines and falls in the conveyor movement in the solder bath. In order to ensure the fixed power of the heat-release plate 1 to the printed board 2, after the heat-release plate 1 is inserted into the printed board 2, it is necessary to bend with respect to the printed board 2 both or one of the leading end portions of the supporting clamp 3, which are divided into two (refer to FIGS. 8B, 8D).

FIGS. 12A-12D are views each illustrating a heat-release plate assembly component using a supporting clamp 13 different from the supporting clamp 3 illustrated in FIGS. 10A, 10B.

In FIGS. 12A-12D, the heat-release plate 11 is aluminum having a thickness of about 2-3 mm, and is a flat plate (is not curved into an L-shape or a U-shape). More specifically, the heat-release plate 1 has a configuration which can not stand by itself on the printed board 2.

The supporting clamp 13 has an L-shape in a cross section. The supporting clamp 13 is mounted on one end portion of the heat-release plate 11 by the screw 4c and the supporting clamp 13 is mounted on the other end portion of the heat-release plate 11 by the screw 4c. The semiconductor components 4 are mounted on the heat-release plate 11 by the screws 4c, respectively. The heat-release plate 11 has a U-shape as seen from the top in a state in which the supporting clamps 13 are mounted, and the heat-release plate 11 is standable on the printed board 2.

FIGS. 14A-14C are views each illustrating the supporting clamp 13 and the shape of the square hole 5 formed in the printed board 2. The supporting clamp 13 is made of solderable electrogalvanized steel having a thickness of about t2=0.8 mm, in order to ensure the strength of the supporting claim 13 and to be directly mounted on the supporting plate 11 by the screw 13a illustrated in FIG. 15A.

The leading end portion of the insertion portion of the supporting clamp 13 which projects from the back face of the printed board 2 includes on one side thereof a tapered shape (tapered portion 13c), and one locking claw 13b which engages with the back face (solder surface) of the printed board 2. The square hole 5 formed in the printed board 2 is formed such that the length C of the long side becomes longer than the length A of the locking claw 13b of the leading end portion of the insertion portion of the supporting clamp 13 by about 0.1-0.2 mm (C=A+0.1-0.2 mm).

The width (length of short side) of the square hole 5 of the printed board 2 is about 1.6 mm with respect to the thickness of the supporting clamp 13, t2=0.8 mm. The pattern beaten-copper portion 2b is formed in the entire circumference of the square hole 5. The entire circumference of the leading end portion of the supporting clamp 13 is soldered to the pattern beaten-copper portion 2b.

The printed board 2 includes a hole 2c through which a lead 4b of the semiconductor component 4 penetrates. This hole 2c is formed such that the locking claw 13b of the supporting clamp 13 engages with the end of the square hole 54 of the printed board in a position offset by E+α.

FIGS. 15A, 15B are views each illustrating a screw having a spring washer and a flat washer for preventing looseness. The screw 13a includes a screw portion having a screw groove and an imperfect screw portion without having a screw groove. As illustrated in FIG. 15A, this imperfect screw portion includes the spring washer 6a and the flat washer 6b.

Therefore, when mounting the supporting clamp 13 on the heat-release plate 11 by the screw 13a, the whole portion of the screw portion is not always threadably mounted on the heat-release plate 11, and a part of the screw portion is threadably mounted on the heat-release plate 11.

The measurement in which the screw portion is threadably mounted on the heat-release plate 11 is reduced if the thickness of the supporting clamp 13 and the heat-release plate 11 is reduced. For this reason, in order to reliably perform the screwing, it is necessary to use a material having a certain thickness for the supporting clamp 13. Consequently, although the strength of the supporting clamp 13 is increased, the elasticity of the supporting clamp is decreased, so that it becomes difficult to assemble the supporting clamp 13 to the printed board 2.

FIGS. 16A-16C are views each illustrating positional change between the leading end portion of the supporting claim 13 and the lead 4b of the semiconductor component 4 when mounting the supporting clamp 13 of FIGS. 14A-14C on the printed board 2.

Referring to FIG. 16A, the leading end portion of the supporting clamp 13 is inserted into the square hole 5 of the printed board 2 while inserting the lead 4b of the semiconductor component 4 into the offset hole 2c of the printed board 2. The bending force is thereby applied to the lead 4b of the semiconductor component 4.

FIG. 16B provides a view when the locking claw 13b of the leading end portion of the insertion portion of the supporting clamp 13 is inserted into the square hole 5 of the printed board 2. As illustrated in FIGS. 14A-14C, since the length A of the leading end portion of the insertion portion of the supporting clamp 13 including the locking claw 13b is set to be shorter than the length C of the square hole 5 of the printed board 2 by about 0.1-0.2 mm (refer to FIGS. 14A-14C), the leading end portion of the insertion portion of the supporting clamp 13 is inserted while the locking claw 13b has contact with the inner wall of the square hole 5. If the leading end portion of the insertion portion of the supporting clamp 13 is further inserted, the lead 4b of the semiconductor component 4 significantly curves, and the curving force to be applied to the lead 4b is increased.

FIG. 16C illustrates a state in which the locking claw 13b of the leading end portion of the insertion portion of the supporting clamp 13 projects from the back face (solder surface) of the printed board 2. If the locking claw 13b projects from the back face (solder face), the lead 4b of the semiconductor component 3 becomes free from the bending force, and the shape of the lead gets back to the original shape. By this lead 4b, the heat-release plate 11 to which the semiconductor component 4 is screwed and the supporting clamp 13 move in the arrow Y2 direction (the direction opposite to the arrow Y1), and the locking claw 13b of the leading end portion of the supporting clamp 13 engages with the back face of the printed board 2. Thereby, the heat-release plate 11 is fixed to the printed board 2.

With this fixing method, the heat-release plate 11 does not incline in the left direction of FIG. 16C. However, the leading end portion of the insertion portion of the supporting clamp 13 engages with the printed board 2 only on one side (right side in the figure), so that the inclination in the right direction is not completely controlled (refer to FIGS. 14A-14C).

The above-described mounting of the heat-release plate on the printed board in the power source device has a problem regarding workability when mounting the heat-release plate on the printed board, a problem regarding the installation of a dedicated fixing jig, a dedicated equipment and the like and the maintenance fee, a problem regarding the increase in a solder process, a problem regarding the inclination and the floating of the heat-release plate after soldering, a problem regarding the solder strength and the like.

When removing the heat-release plate fixed on the printed board by soldering from the printed board by the heat of the soldering iron, if the area of the soldered portion is large, the heat is taken by the heat-release plate. For this reason, it becomes difficult to remove the heat-release plate.

SUMMARY OF THE INVENTION

The present invention has been made in view of the above problems, and an object of the present invention is to provide a heat-release configuration, which can manually mount a heat-release plate on a printed board, can prevent inclination and floating of the heat-release plate, can solder by a solder bath, can ensure sufficient the fixed power of the heat-release plate to the printed board, and can easily remove the heat-release plate without damaging a pattern of the printed board when removing the heat-release plate in repairing, a supporting clamp of the heat-release plate and a method of assembling the heat-release configuration.

In order to achieve the above object, an embodiment of the present invention provides a heat-release configuration, including: a printed board on which a semiconductor component is mounted; a heat-release plate which is mounted on the semiconductor component, and configured to diffuse heat generated by the semiconductor component; and a supporting clamp which is mounted on the heat-release plate, and configured to fix the heat-release plate to the printed board via a hole provided in the printed board, the supporting clamp including a sectional L-shape in a horizontal direction having two flat surfaces substantially orthogonal to each other, the supporting clamp having on a lower side of each of the flat surfaces a leading end portion which is inserted into the hole of the printed board and a locking claw which is formed in the leading end portion and projects outside the L-shape, and the locking claw engaging with a back face of the printed board when the leading end portion is inserted into the hole of the printed board.

The embodiment of the present invention also provides a supporting clamp which is mounted on the printed board of a heat-release plate of a semiconductor component mounted on the printed board, including: two flat surfaces orthogonal to each other, which are formed by bending a metal plate having a solderable surface treatment into a sectional L-shape in the horizontal direction; a leading end portion in which a part of each flat surface on the side of the printed board extends along a bending line; and a locking claw which is provided in the leading end portion, and projects outside the L-shape.

The embodiment of the present invention also provides a power source device including the above-described heat-release configuration.

The embodiment of the present invention also provides a method of assembling a heat-release configuration of a semiconductor component which mounts a heat-release plate of the semiconductor component on a printed board having the semiconductor component, including: a step of mounting the semiconductor component on the heat-release plate; a step of mounting a supporting clamp on the heat-release plate, the supporting clamp including a sectional L-shape in a horizontal direction having two flat surfaces orthogonal to each other, a leading end portion on a lower side of each flat surface, and a locking claw which is provided in the leading end portion, and projects outside the L-shape; and a step of inserting the leading end portion of the supporting clamp into a hole provided in the printed board, such that the locking claw engages with a back face of the printed board.

BRIEF DESCRIPTION OF THE DRAWINGS

The accompanying drawings are included to provide further understanding of the invention, and are incorporated in and constitute a part of this specification. The drawings illustrate an embodiment of the invention and, together with the specification, serve to explain the principle of the invention.

FIG. 1A provides a top view; FIG. 1B provides a plan view illustrating a part of the heat-release configuration in cross section; FIG. 1C provides a bottom view; FIG. 1D provides a right side view illustrating a part of the heat-release configuration in cross section.

FIG. 2A provides a plan view; FIG. 2B provides a right side view.

FIG. 3A provides a left side view, FIG. 3B provides a front view, FIG. 3C provides a bottom view; FIG. 3D provides a sectional view along SC-SC line in FIG. 3A; FIG. 3E provides a sectional view along SD-SD line in FIG. 3A.

FIG. 5A provides a front view and a bottom view; FIG. 5B provides an enlarged view of S portion in FIG. 5A; FIG. 5C provides a bottom view of the printed board on which the heat-release plate is mounted.

FIGS. 6A, 6B, 6C are views each illustrating change in the leading end portion of the supporting clamp when mounting the supporting clamp on the printed board.

FIGS. 8A, 8B, 8C, 8D are views each illustrating a conventional heat-release configuration; FIG. 8A provides a top view; FIG. 8B provides a front view illustrating a part in cross-section; FIG. 8C provides a bottom view; FIG. 8D provides a right side view illustrating a part in cross-section.

FIG. 9A provides a front view; FIG. 9B provides a bottom view; FIG. 9C provides a right side view.

FIG. 12A provides a top view; FIG. 12B provides a front view illustrating a part in cross section; FIG. 12C provides a bottom view; FIG. 12D provides a right side view illustrating a part in cross section.

FIG. 13A provides a front view; FIG. 13B provides a right side view.

FIG. 14A provides a view illustrating a supporting clamp for supporting the heat-release plate in FIGS. 12A-12D; FIG. 14B provides a bottom view of the printed board in FIG. 14A; FIG. 14C provides a right side view of FIG. 14A and the bottom view of the printed board.

FIGS. 16A, 16B, 16C are views each illustrating a positional change of the leading end portion of the supporting clamp and a lead of the semiconductor component when the supporting clamp is mounted on the printed board.

DETAILED DESCRIPTION OF THE PREFERRED EMBODIMENT

Hereinafter, an embodiment of the present invention will be described with reference to the accompanying drawings.

Embodiment

Figure 1A:
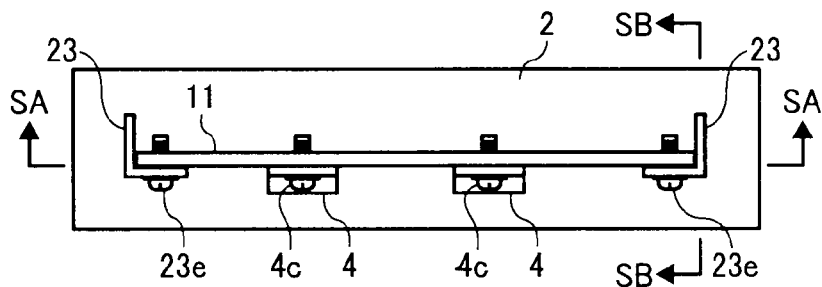
FIGS. 1A, 1B, 1C, 1D are views each illustrating a heat-release configuration according to an embodiment of the present invention.
Figure 1B:
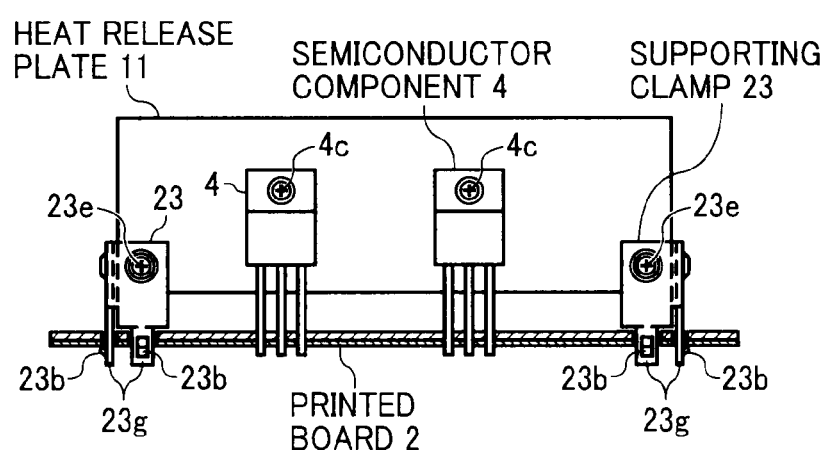
Figure 1D:
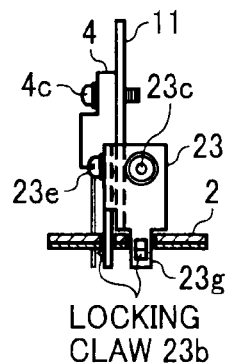
Figure 1C:
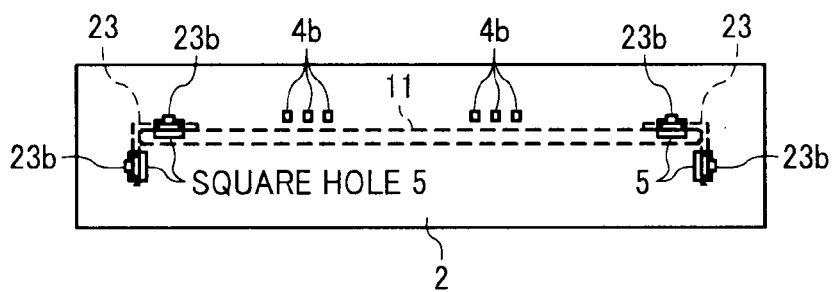

FIGS. 1A, 1B, 1C, 1D are views each illustrating a heat-release configuration according to the embodiment of the present invention; FIG. 1A provides a top view; FIG. 1B provides a sectional view along SA-SA line in FIG. 1A; FIG. 1C provides a bottom view; FIG. 1D provides a right side view along SB-SB line in FIG. 1A. In addition, the same reference numbers are applied to the portions which are the same as the conventional portions described in FIGS. 12A-12D.

Referring to FIGS. 1A-1D, a flat heat-release plate 11 has on one end thereof a supporting clamp 23 and on the other end thereof a supporting clamp 23. The supporting clamp 23 has a sectional L-shape in the horizontal direction. The supporting clamp 23 is mounted on the heat-release plate 11 by a screw 23e. A semiconductor component 4 is also mounted on the heat-release plate 11 by a screw 4c.

In a state in which the supporting clamp 23 is mounted on one end of the heat-release plate 11 and the supporting clamp 23 is mounted on the other end of the heat-release plate 11, the heat-release plate 11 and the supporting clamps 23, 23 as a whole can be seen as a U-shape when observing them from the top. The heat-release plate 11 can stand by itself if the heat-release plate 11 is mounted on a printed board 2. The supporting clamp 23 engages with the printed board 2 by a total of four locking claws 23b provided in the supporting clamp 23.

Figure 2A:
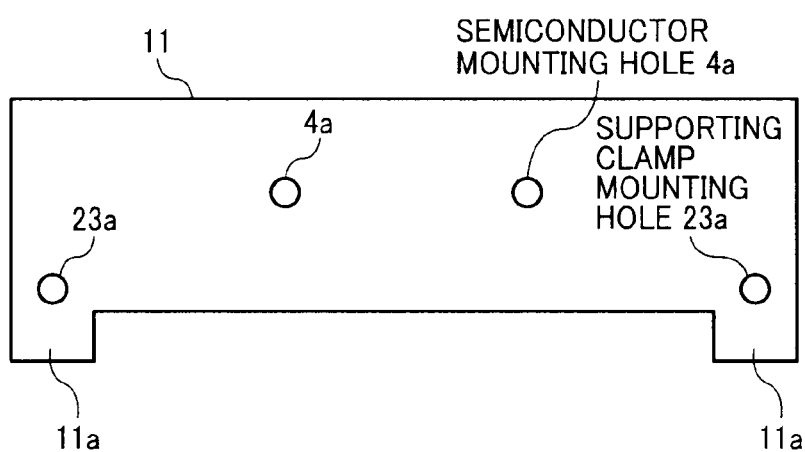
FIGS. 2A, 2B are views each illustrating a heat-release plate in the heat-release configuration according to the embodiment of the present invention.
Figure 2B:
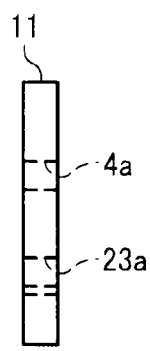

FIGS. 2A, 2B are views each illustrating the heat-release plate 11; FIG. 2A provides a front view; FIG. 2B provides a right side view. This heat-release plate 11 is made of an aluminum flat plate having a thickness of about 2-3 mm. The heat-release plate 11 does not have a curved shape such as an L-shape, a U-shape or a Z-shape as with the conventional heat-release plate when seeing the heat-release plate 11 in the plan view. Therefore, the heat-release plate 11 can stand on the printed board 2.

The heat-release plate 11 has on one end portion thereof a projection 11a and on the other end portion thereof a projection 11a. The projection 11a projects downwardly. The heat-release plate 11 has on one end portion thereof a supporting clamp mounting hole 23a near the upper portion of the projection 11a and on the other end portion thereof a supporting clamp mounting hole 23a near the upper portion of the projection 11a. The supporting clamp mounting hole 23a is used to mount the supporting clamp 23 by a screw and is formed by tapping with an M3 screw. The heat-release plate 11 also has two semiconductor component mounting holes 4a in two arbitrary positions near the central portion of the heat-release plate 11. The semiconductor component mounting hole 4a is used to mount the semiconductor component 4 by a screw, and is formed by tapping with an M3 screw.

Figure 3A:
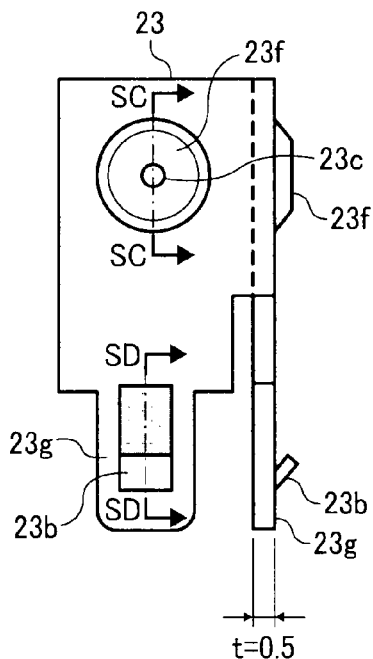
FIGS. 3A, 3B, 3C, 3D, 3E are views each illustrating a supporting clamp in the heat-release configuration according to the embodiment of the present invention.
Figure 3B:
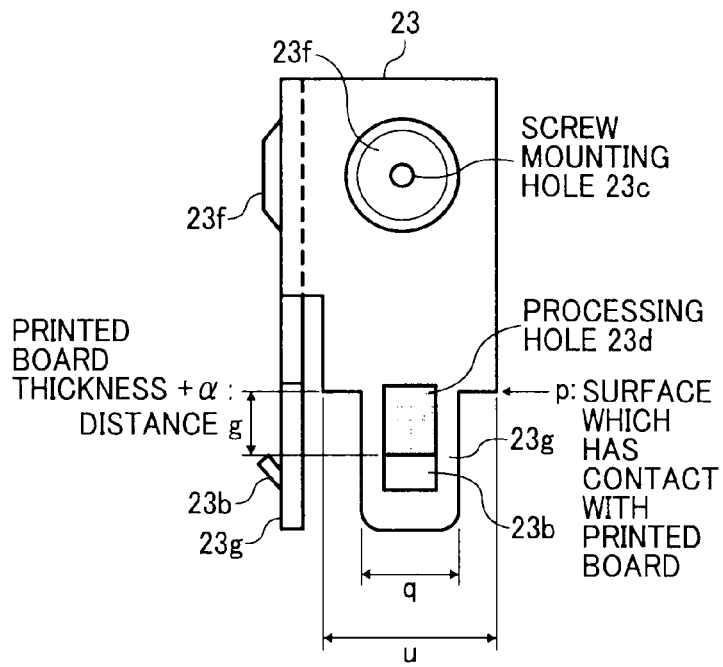
Figure 3C:
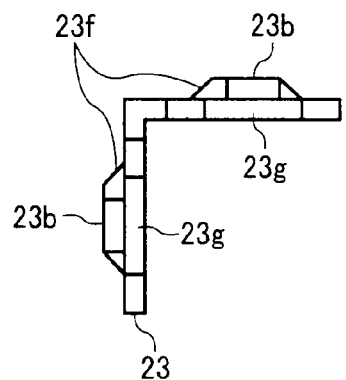
Figure 3D:
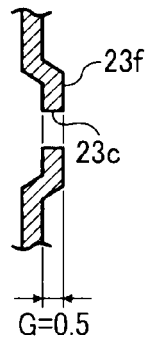
Figure 3E:
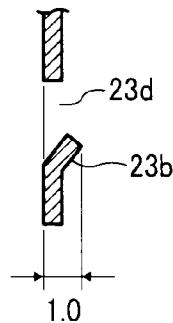

FIGS. 3A, 3B, 3C, 3D, 3E are views each illustrating the supporting clamp 23; FIG. 3A provides a left side view; FIG. 3B provides a front view; FIG. 3C provides a bottom view; FIG. 3D provides a sectional view along SC-SC line in FIG. 3A; FIG. 3E provides a sectional view along SD-SD line in FIG. 3A.

The supporting camp 23 is made of solderable electrogalvanized steel having a thickness of about t3=0.5 mm, in order to ensure strength and elasticity.

The supporting clamp 23 is curved into a sectional L-shape in the horizontal direction. If this supporting clamp 23 is mounted on the heat-release plate 11 on the right and left one by one, the entire shape becomes a U-shape when seen in the plan view, and the heat-release plate can stand on the printed board 2. The supporting clamp 23 has a symmetric shape in a development view because the same supporting clamps 23 are used on both sides of the heat-release plate 11, respectively.

The supporting clamp 23 has a screw mounting hole 23c corresponding to the supporting clamp mounting hole 23a of the heat-release plate 11. In order to reliably fix the supporting clamp 23 having a thickness of about t3=0.5 mm to the supporting plate 11, the supporting clamp 23 has a circular base 23f in which the portion provided with the screw mounting hole 23c projects to the outside of the L-shape. This circular base 23f is formed by an extrusion process. FIG. 3D illustrates a sectional view of the portion provided with the circular base 23f, and the extrusion amount G is about 0.5 mm.

Figure 4A:
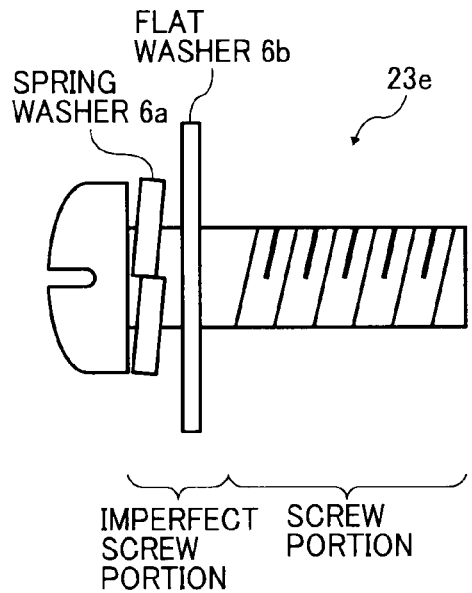
FIG. 4A provides a view illustrating a screw having a spring washer and a flat washer.
Figure 4B:
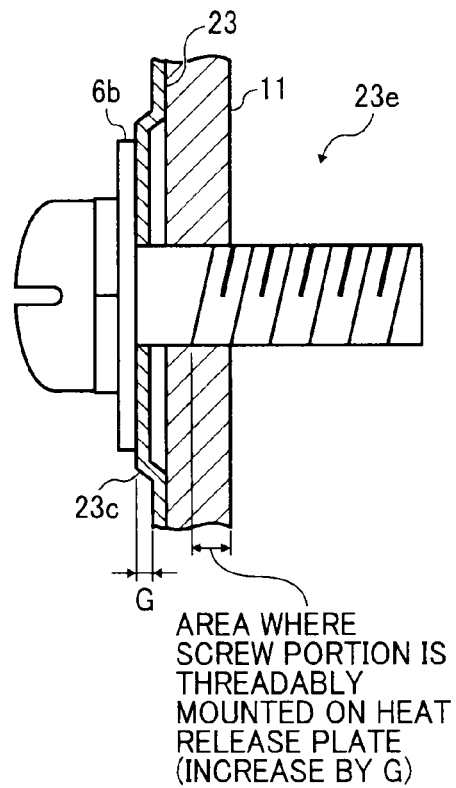
FIG. 4B provides a view illustrating a state in which the supporting clamp in FIGS. 3A-3E is fixed to the heat-release plate by using the screw.

Therefore, the apparent thickness of a screw insertion portion (near the screw mounting hole 23c) is about 1 mm, the length in which the screw potion is threadably mounted on the heat-release plate 11 is increased, and the fixing by the screw is increased (refer to FIGS. 4A, 4B).

FIGS. 4A, 4B are views each illustrating a screw having a spring washer and a flat washer for preventing looseness. As illustrated in FIG. 4A, the screw 23e includes an imperfect screw portion having a spring washer 6a and a flat washer 6b.

When the supporting clamp 23 is mounted on the heat-release plate 11 by the screw 23e, the portion in which the screw portion is threadably mounted on the heat-release plate 11 is a part of the thickness direction as illustrated in FIG. 4B, which is not the entire length of the thickness direction.

This area is decreased if the thickness of the supporting clamp 23 and the heat-release plate 11 is reduced. Therefore, in order to perform screwing, it is necessary to use a material having a certain thickness for the supporting clamp 23. Thereby, the strength of the supporting clamp 23 is increased, but the elasticity of the supporting clamp 23 is decreased, and it becomes difficult to mount the heat-release plate 11 on the printed board 2.

However, in the present embodiment, since the area in which the screw portion is threadably mounted on the heat-release plate 11 is increased by the circular base 23f, it is not necessary to increase the thickness of the supporting clamp 23 for reliably performing the screwing. Therefore, the elasticity of the supporting clamp 23 is ensured, and the heat-release plate 11 can be easily mounted on the printed board 2.

The screw mounting hole 23c has an inner diameter of about 3.2 mm, and is set such that the supporting clamp 23 is positioned at an allowable tolerance of about ±0.1 mm when it is screwed to the heat-release plate 11 by M3 screw.

The supporting clamp 23 is curved into a sectional L-shape in the horizontal direction, and has two flat surfaces. A part of a lower side end portion of each flat surface extends downwardly along a bending line (bending line which is formed when bending into the L-shape), and includes a leading end portion 23g. Each surface of the leading end portion 23g includes a locking claw 23b projecting toward the outside of the L-shape.

As illustrated in FIG. 3E, the locking claw 23b projects about 0.5 mm from the flat surface portion of the supporting clamp 23, and is formed by a cutting and bending process. Therefore, the locking claw 23b is formed in the direction such that the supporting clamp 23 has elasticity. A processing hole 23d provided above the locking claw 23b is a clearance hole required for forming the locking claw 23b by the cutting and bending process.

The supporting clamp 23 has on a right side of the leading end portion 23g a p-surface with which the printed board 2 has contact, and on a left side of the leading end portion 23g a p-surface with which the printed board 2 has contact. The supporting clamp 23 is supported on the side of the component mounting surface of the printed board by the p-surface. The distance g between the p-surface and the leading end portion of the locking claw 23b is formed with a measurement of about 1.6 mm+(0.2-0) mm with respect to the printed board having a thickness of about 1.6 mm, and the printed board is sandwiched between the p-surface and the locking claw 23b.

Figure 5A:
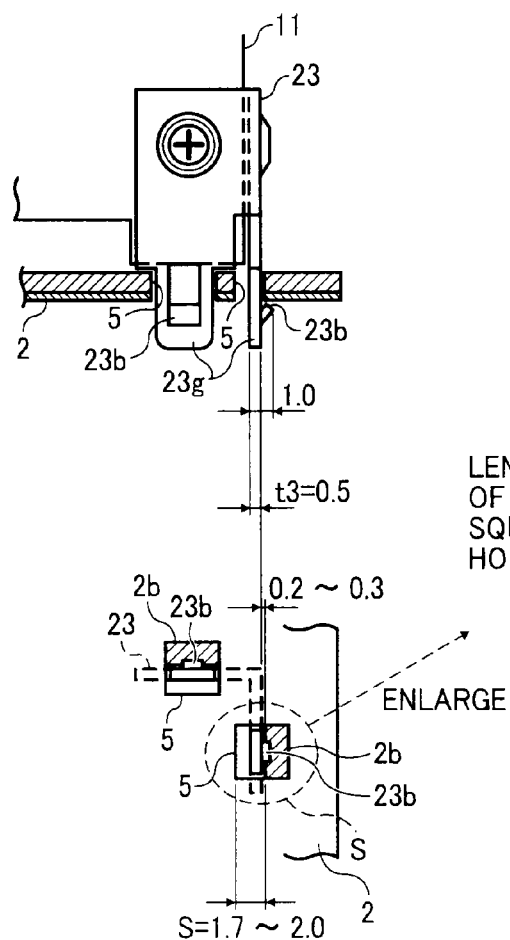
FIGS. 5A, 5B, 5C are views each illustrating a state in which the leading end portion of the supporting clamp in FIGS. 3A-3E is inserted into a square hole of the printed board.
Figure 5B:
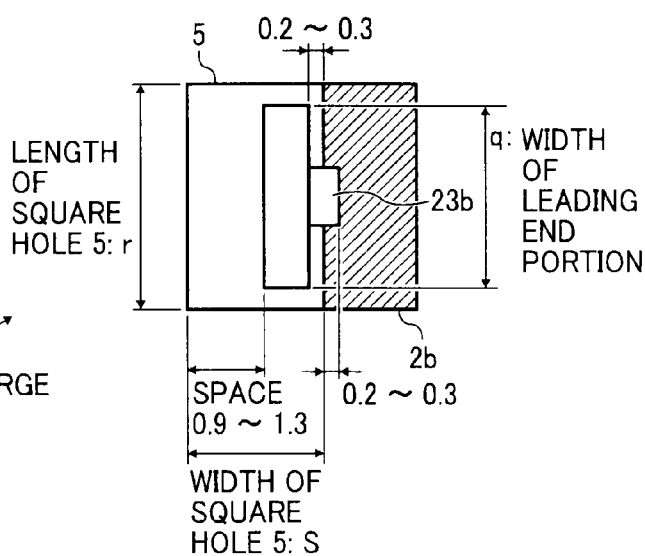
Figure 5C:
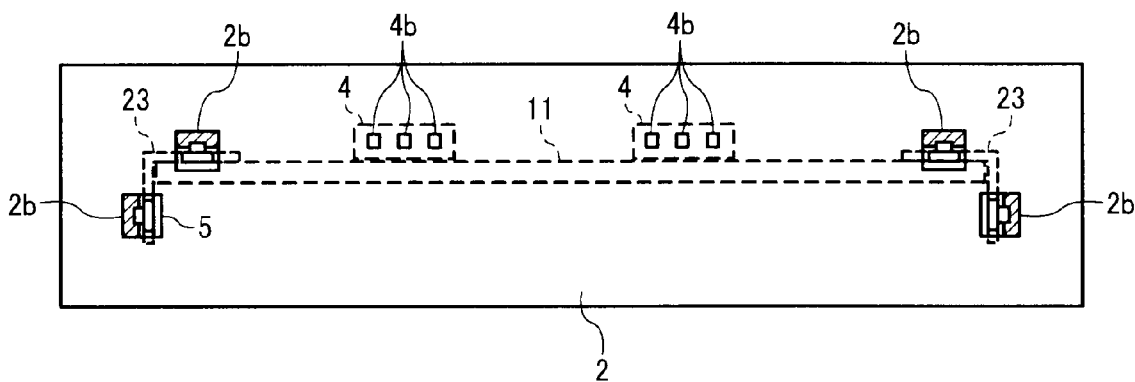

FIGS. 5A, 5B, 5C are views each illustrating a state in which the leading end portion 23g of the supporting clamp 23 is inserted into the square hole 5 of the printed board 2; FIG. 5A provides a front view; FIG. 5B provides a bottom view; FIG. 5C provides an enlarged view of S-portion.

The length r of the square hole 5 of the printed board 5 is longer than the width q of the leading end portion 23g of the supporting clamp 23, and the distance u between the sides separate from the leading end portions 23g of two p-surfaces provided in the right and left sides of the leading end portion 23g of the supporting clamp 23 is longer than the length r (q<r<u). By this measurement relationship, the leading end portion 23g is effectively inserted into the square hole 5 of the printed board 2, and the p-surface is reliably mounted on the mounting face of the printed board 2.

The width s of the square hole 5 of the printed board 2 is about 1.7-2.0 mm, and is set to be larger than the thickness of the supporting clamp 23, t3=about 0.5 mm. As illustrated in FIG. 5C, the square hole 5 of the printed board 2 is located such that the locking claw 23b of the supporting clamp 23 engages with one side of the square hole 5 of the printed board 2 by about 0.2-0.3 mm. Therefore, in the circumferential face of the square hole 5 of the printed board 2, a space of about 0.9-1.3 mm is formed on the side opposite to the side where the locking claw 23b of the supporting clamp 23 exists.

A pattern beaten-copper portion 2b is not provided in the entire circumference of the square hole 5 of the printed board 2, and is provided only on the back face of the printed board 2 of the side where the locking claw 23b of the supporting clamp 23 exists. The surface of the supporting clamp 23 which has contact with the pattern beaten-copper portion 2b is only fixed to the pattern beaten-copper portion 2b, i.e., the printed board 2 by soldering.

FIG. 5C provides a bottom view of the printed board 2 on which the heat-release plate 11 (heat-release plate assembly component) having the supporting clamp 23 in the right end portion and the supporting clamp 23 in the left end portion is mounted. In one heat-release plate assembly component, the four locking claws 23b engage with the printed board 2. The pattern beaten-copper portions 2b and the surfaces of the supporting clamps 23 which have contact with the pattern beaten-copper portions 2b are soldered. Thereby, the supporting clamps 23 are fixed to the printed board 2.

FIGS. 6A, 6B, 6C are views each illustrating change in the leading end portion 23g of the supporting clamp 23 when mounting the supporting clamp 23 on the printed board 2.

FIG. 6A illustrates a state in which the leading end portion 23g of the supporting clamp 23 mounted on the heat-release plate 11 is inserted into the square hole 5 of the printed board 2. In this case, the leading end portion 23g of the supporting clamp 23 does not change in shape.

FIG. 6B illustrates a state in which the locking claw 23b of the supporting clamp 23 is inserted into the square hole 5 of the printed board 2. The right side leading end portion 23g of the supporting clamp 23 in FIG. 6B has an elasticity in the arrow D and the arrow D' directions. As illustrated FIG. 6A, the square hole 5 has a space of about 0.9-1.3 mm between the surface having the locking claw 23b and the surface facing that surface. Therefore, if the locking claw 23b is inserted into the square hole 5, the leading end portion 23g of the supporting clamp 23 is bent in the arrow D direction. Since the leading end portion 23g of the supporting clamp 23 is bent, the contact resistance between the locking claw 23b and the printed board 2 is reduced, and the supporting clamp 23 can be easily inserted into the square hole 5 without requiring a large force when manually inserting the supporting clamp 23.

FIG. 6C illustrates a state in which the locking claw 23b of the supporting clamp 23 engages with the pattern beaten-copper portion 2b of the printed board 2. The leading end portion 23g of the supporting clamp 23 gets back to the original shape by the elasticity, and the locking claw 23b engages with the pattern beaten-copper portion 2b of the printed board 2 by about 0.2-0.3 mm. Thereby, the heat-release plate 11 and the printed board 2 are fixed.

One supporting clamp 23 includes two locking claws 23b, and the heat-release plate 11 includes two supporting clamps 23 right and left one by one. Therefore, one heat-release plate 11 sandwiches the printed board 2 by the four locking claws 23b. As a result, in the assembly process of the power source device, required fixed power can be obtained, and the inclination and falling of the heat-release plate 11 can be prevented.

In this state, the printed board 2 is put in the solder bath, and the four pattern beaten-copper portions 2b which are mounted on the printed board 2 and the supporting clamps 23 as illustrated in FIG. 5C are soldered by single soldering. Consequently, the heat-release plate 11 is fixed to the printed board 2 by the supporting clamps 23.

FIGS. 7A-7F provide views each describing an operation which removes solder around the supporting clamp 23 in repairing. FIGS. 7A-7D provide views each illustrating an operation which removes a solder when the entire circumference of the supporting clamp 23 is soldered.

Figure 7A:
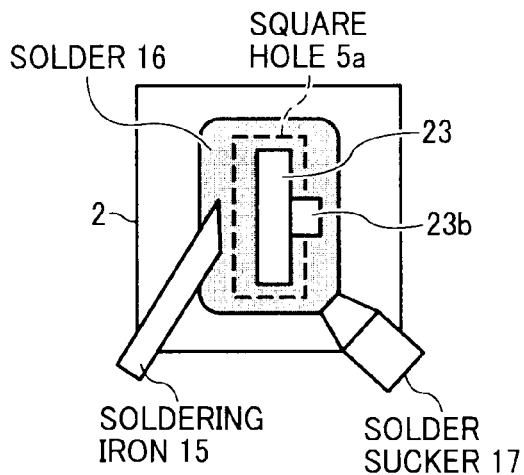
FIGS. 7A, 7B, 7C, 7D provide views each illustrating a procedure for removing solder when the entire circumference of the supporting clamp is soldered.

If the entire circumference of the supporting clamp 23 is soldered, as illustrated in FIG. 7A, one of the supporting clamps 23 is heated by a soldering iron 15, and the solder 16 is removed by a solder sucker 17 from the opposite side while melting the solder 16. In this case, the solder 16 with which the soldering iron 15 has contact can hardly be removed.

Figure 7B:
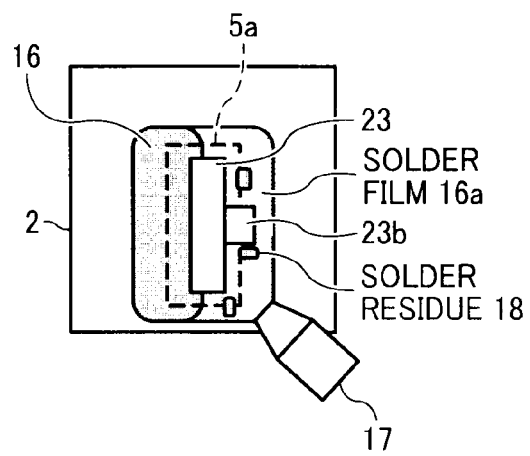

As illustrated in FIG. 7B, on the side in which the solder 16 is removed by the solder sucker 17, after removing, a thin solder film 16a and a solder residue 18 which are not removed stay in the pattern beaten-copper portion (in rare cases, the solder can be completely removed).

The solder residue 18 remaining in the pattern beaten-copper portion often exists near the supporting clamp 23, or may fix the supporting clamp 23 to the printed board 2 even after the removing.

Figure 7C:
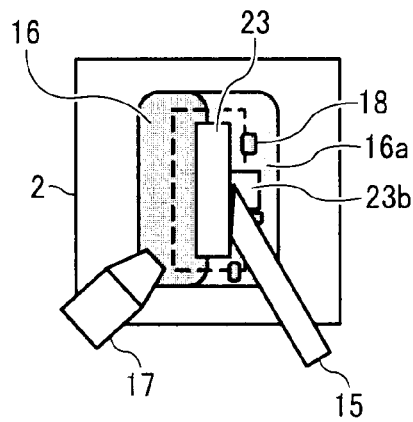

Next, as illustrated in FIG. 7C, the soldering iron 15 has contact with the supporting clamp 23 from the side opposite to the side illustrated in FIG. 7A, and the solder 16 is removed by the solder sucker 17 while heating the solder on the side opposite to the portion where the solder 16 in FIG. 7B is removed via the supporting clamp 23.

Figure 7D:
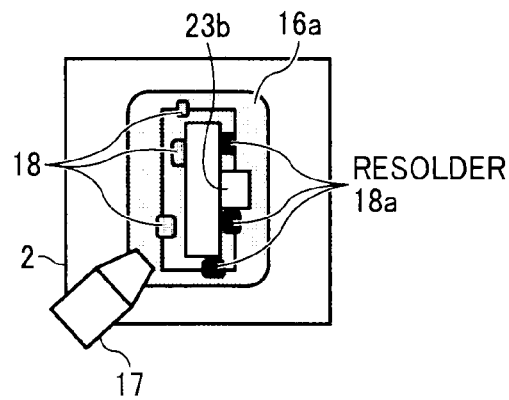

In this case, as illustrated in FIG. 7D, the residual solder 18 remaining in the pattern beaten-copper portion on the side with which the soldering iron 15 in FIG. 7C has contact becomes resolder 18a, and reconnects the supporting clamp 23 and the printed board 2.

Consequently, when the entire circumference of the supporting clamp 23 is soldered, it is necessary to repeat the above-described operation which removes solder several times in order to remove the supporting clamp 23 from the printed board 2. By repeating this operation several times, the pattern of the printed board 2 may be separated by heat. It is not easy to remove the once soldered supporting clamp 23 without destroying the pattern of the printed board 2.

Figure 7E:
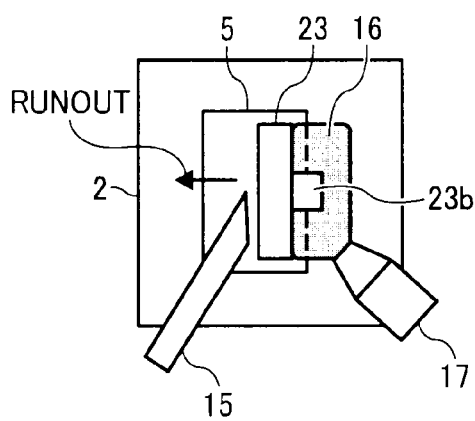
FIGS. 7E, 7F provide views each illustrating a procedure for removing solder when only one face of the supporting clamp is soldered.
Figure 7F:
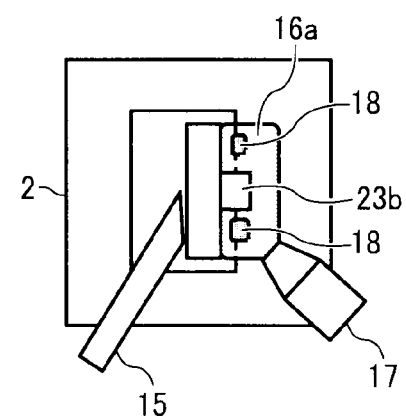
Figure 9A:
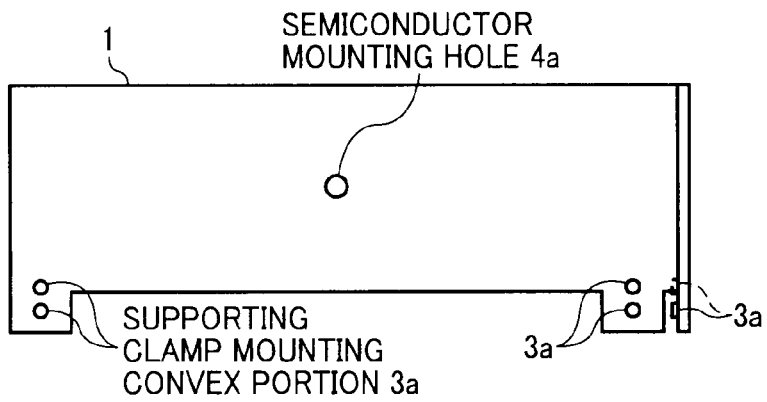
FIGS. 9A, 9B, 9C are views each illustrating a conventional heat-release plate.
Figure 9C:
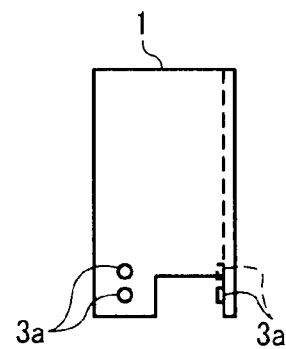
Figure 9B:
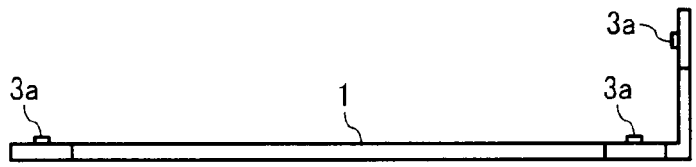
Figure 10A:
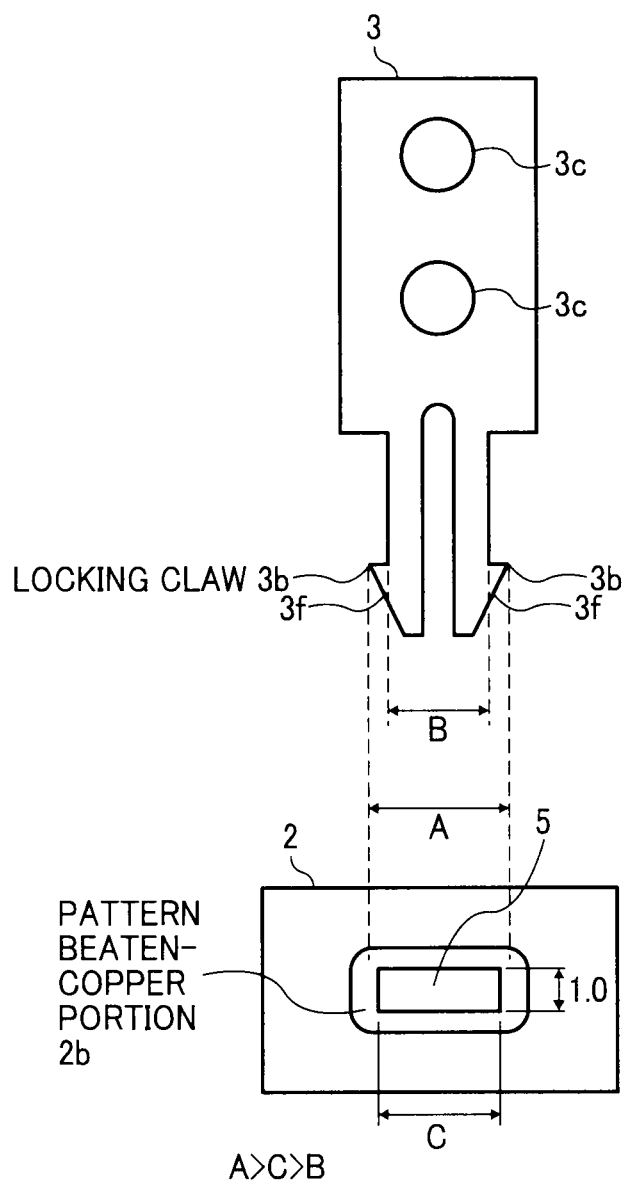
FIG. 10A provides a front view illustrating a supporting clamp for supporting the heat-release plate in FIGS. 8A-8D and a bottom view of the printed board having the square hole into which the leading end portion of the supporting clamp is inserted.
Figure 10B:
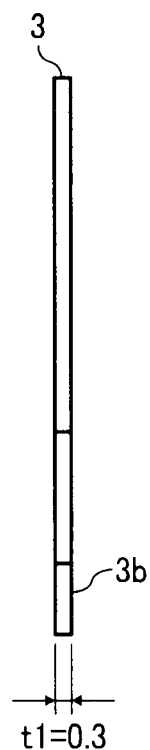
FIG. 10B provides a right side view of the supporting clamp.
Figure 11A:
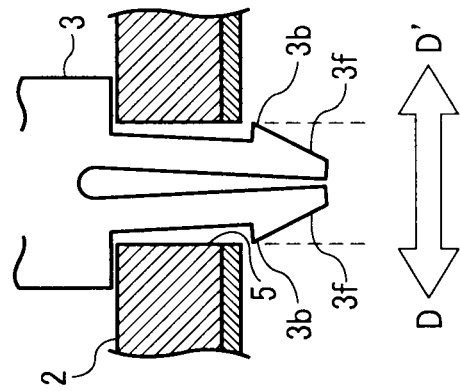
FIGS. 11A, 11B, 11C provide views each illustrating change in a shape of the leading end portion of the supporting clamp when the supporting clamp is mounted on the printed board.
Figure 11B:
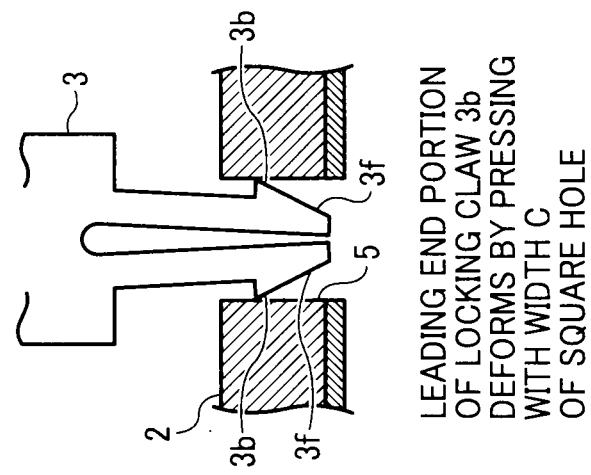
Figure 11C:
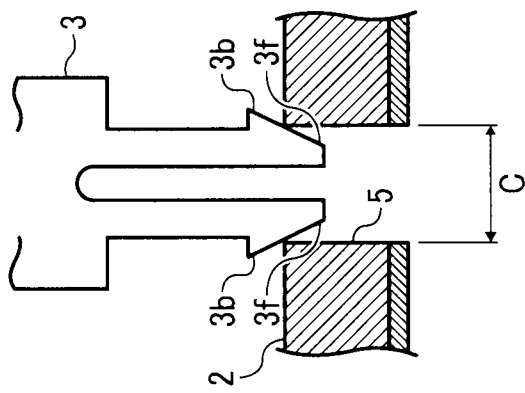
Figure 12A:
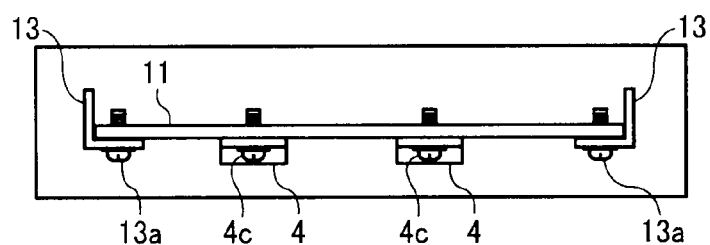
FIGS. 12A, 12B, 12C, 12D are views each illustrating a conventional heat-release configuration using another supporting clamp.
Figure 12B:
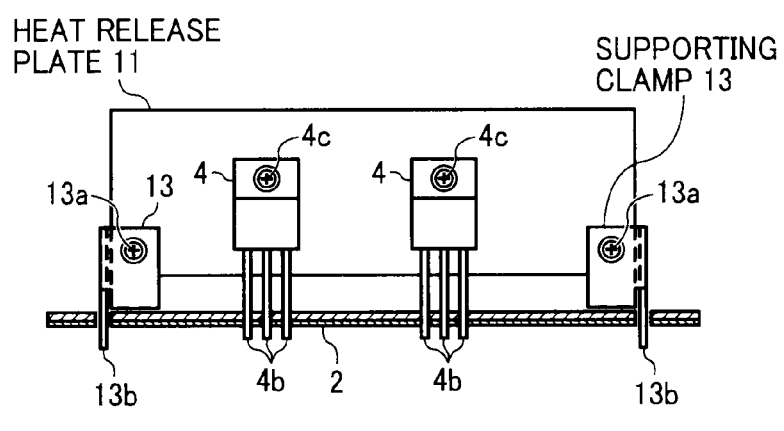
Figure 12D:
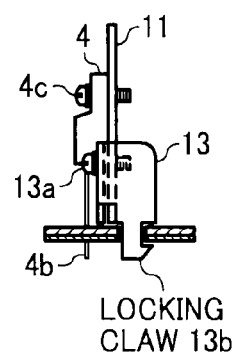
Figure 12C:
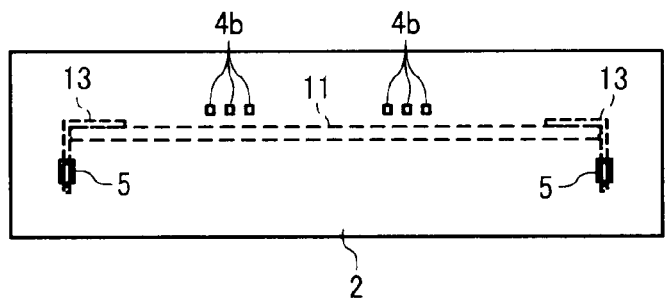
Figures 13A, 13B:
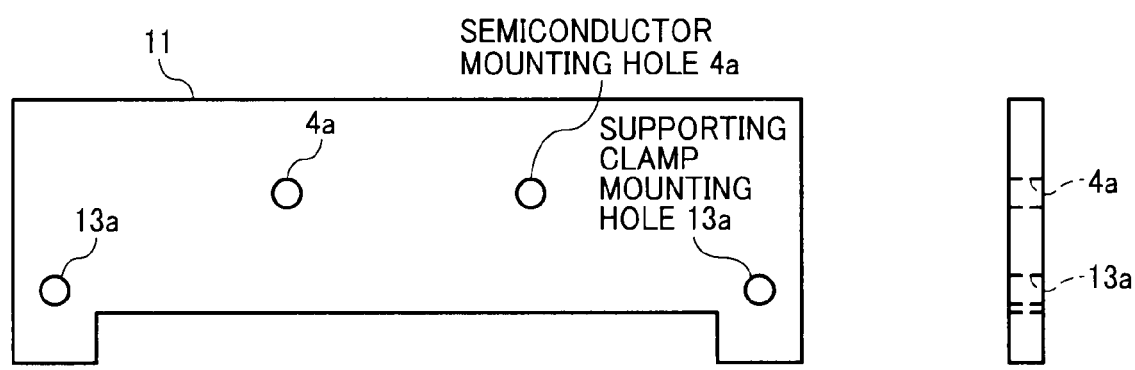
FIGS. 13A, 13B are views each illustrating a heat-release plate in FIGS. 12A-12D.
Figure 15A:
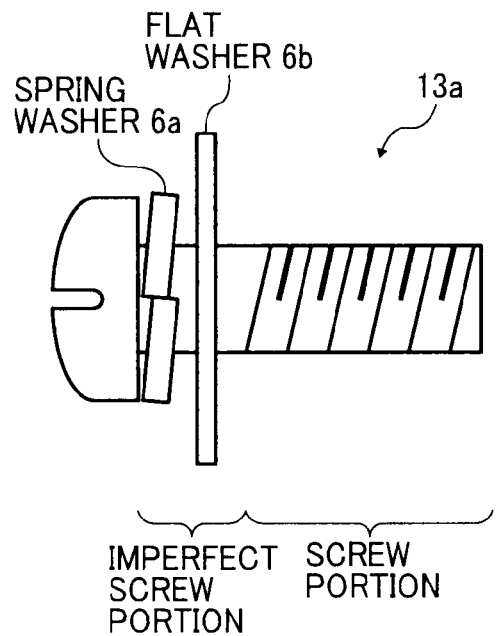
FIG. 15A provides a view illustrating a screw having a spring washer and a flat washer.
Figure 15B:
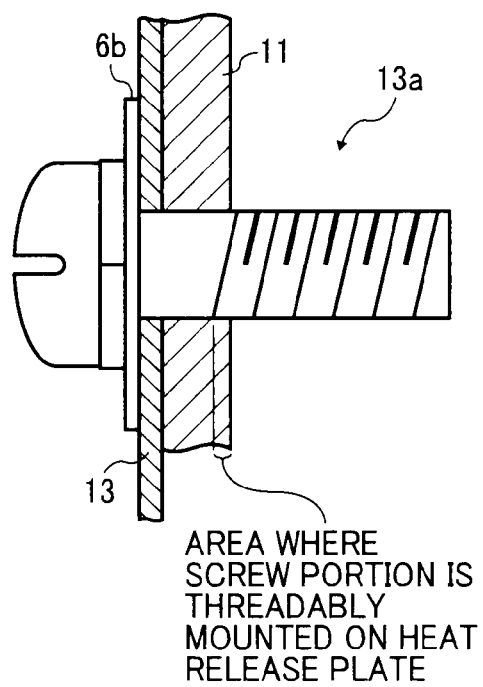
FIG. 15B provides a view illustrating a state in which the supporting clamp is fixed to the supporting plate by using the screw.

FIGS. 7E, 7F provide views each describing an operation which removes solder when one face of the supporting clamp 23 is only soldered and a space exists between the soldered face and the opposite side.

As illustrated in FIG. 7E, the supporting clamp 23 is heated by the soldering iron 15 from the side opposite to the side to which the supporting clamp 23 is soldered, so as to melt the solder 16, and the solder 16 is removed by the solder sucker 17 from the opposite side. Since the square hole 5 of the printed board 2 has a space on the side opposite to the soldered side (left side in FIG. 7E), the solder can be removed while pushing the supporting clamp 23 to the left side by the solder sucker 17.

In this case, as illustrated in FIG. 7F, even if the solder residue 18 stays, a significant space can be formed between the printed board 2 and the supporting clamp 23. Thereby, the supporting clamp 23 can be removed from the printed board 2 by a single operation which removes solder.

In FIGS. 7A-7F, only the printed board 2 near the square hole 5 is simplified to be illustrated by a square, but the printed board 2 in fact has a rectangular shape as illustrated in FIG. 1.

As described above, according to the present invention, the heat-release plate is soldered by a single soldering operation with a solder bath after mounting the heat-release plate to the printed board, the inclination and floating of the heat-release plate after the soldering operation is prevented, and the fixed power of the heat-release plate is ensured, and the removing of the heat-release plate in repairing can be easily performed without damaging the pattern of the printed board.

According to the heat-release plate and the supporting clamp of the heat-release plate of the present embodiment, the heat-release plate can be mounted on the printed board by hand, the single soldering operation can be performed by a solder bath, the inclination and floating of the heat-release plate can be prevented, the sufficient fixed power of the heat-release plate to the printed board can be ensured, and the heat-release plate can be easily removed without damaging the pattern of the printed board when removing the heat-release plate in repairing. Such a heat-release plate and a supporting clamp are effective as a heat-release plate and a supporting clamp for the heat-release plate for use in a countermeasure against heat of a semiconductor component.

According to the above-described embodiment, the heat-release plate assembly component is easily mounted on the printed board by hand, and the four locking claws of the supporting clamps engage with the square holes of the printed board. The fixed power which enable the single soldering operation can be ensured while preventing the inclination and floating of the heat-release plate. The solder can be removed while bending the supporting clamp in the direction where runout exists on the side of the square hole opposite to the side with which the locking claw of the supporting clamp engages, the solder residue amount is small, and the heat-release assembly component can be easily removed.

According to the above-described embodiment, after the heat-release plate is mounted on the printed board, the single soldering operation is performed by a solder bath, the inclination and the floating after the soldering can be prevented, the fixed power of the heat-release plate can be ensured, and the heat-release plate can be easily removed without damaging the pattern of the printed board by the solder sucker while removing the heat-release plate in repairing.

Although the embodiment of the present invention has been described above, the present invention is not limited thereto. It should be appreciated that variations may be made in the embodiment described by persons skilled in the art without departing from the scope of the present invention.

What is claimed is:

1. A heat-release configuration, comprising:
   a printed board on which a semiconductor component is mounted;
   a heat-release plate which is mounted on the semiconductor component, and configured to diffuse heat generated by the semiconductor component; and
   a supporting clamp which is mounted on the heat-release plate, and configured to fix the heat-release plate to the printed board, the supporting clamp including a sectional L-shape in a horizontal direction having two flat surfaces substantially orthogonal to each other, the supporting clamp having on a lower side of each of the flat surfaces an elastically deformable leading end portion which is inserted into a respective hole provided in the printed board and includes a locking claw which is formed in the elastically deformable leading end portion and projects outside the sectional L-shape in a direction that the elastically deformable leading end portion elastically deforms, and the elastically deformable leading end portion is inserted into the respective hole of the printed board by elastic deformation, and the elastically deformable leading end portion returns to an original shape by elasticity after being inserted, such that the locking claw engages with a back face of the printed board,
   wherein the respective hole provided in the printed board includes a square hole having a rectangular shape and a pattern beaten-copper portion only in a circumferential portion on one side of the square hole in a back face of the printed circuit board, and
   wherein the locking claw is locked to the circumferential portion on the one side of the square hole including the pattern beaten copper-portion.

2. The heat-release configuration according to claim 1, wherein each of the flat surfaces of the supporting clamp includes a screw mounting portion having a base shape which is formed to project outside the sectional L-shape by an extruding process for fastening with the heat-release plate.

3. The heat-release configuration according to claim 1, wherein the elastically deformable leading end portion is soldered from a back face side of the printed board after the elastically deformable leading end portion of the supporting clamp mounted on the heat-release plate is inserted into the printed board.

4. A power source device comprising the heat-release configuration according to claim 1.

5. The heat-release configuration according to claim 1, wherein each of the flat surfaces of the supporting clamp comprises:
- a first portion having a first length and a screw mounting portion projecting outside the sectional L-shape,
- a second portion extending from the first portion having a second length less than the first length and being located between the first portion and the elastically deformable leading end portion, and
- wherein the elastically deformable leading end portion has a third length less than the second length.

6. A method of assembling a heat-release configuration of a semiconductor component which mounts a heat-release plate of the semiconductor component on a printed board having the semiconductor component, comprising:
- mounting the semiconductor component on the heat-release plate;
- mounting a supporting clamp on the heat-release plate, the supporting clamp including a sectional L-shape in a horizontal direction having two flat surfaces orthogonal to each other, an elastically deformable leading end portion on a lower side of each flat surface, a locking claw which is provided in each elastically deformable leading end portion, and each locking claw projects outside the sectional L-shape in a direction in which a respective elastically deformable leading end portion elastically deforms; and
- inserting each elastically deformable leading end portion of the supporting clamp into a respective square hole provided in the printed board with one side of each square hole including a pattern beaten-copper portion in a back face of the printed board only in a circumferential portion of the one side, wherein
- each elastically deformable leading end portion returns back to a respective original shape by elasticity, and
- each locking claw engages with the back face of the printed board and locks to the circumferential portion of the one side including the pattern beaten-copper portion.

7. The method of assembling the heat-release configuration of the semiconductor according to claim 6, further comprising soldering a surface of each elastically deformable leading portion of the supporting clamp to a respective pattern copper-beaten portion.

8. A printed board on which a semiconductor component is mounted by supporting clamps, the printed board comprising a plurality of square holes,
- wherein each square hole includes a rectangular shape and a pattern beaten-copper portion only in a circumferential portion on one side of the square hole in a back face of the printed circuit board, and
- wherein the circumferential portion on the one side of each square hole including the pattern beaten-copper portion locks to locking claws of the supporting clamps when the locking claws are inserted into the plurality of square holes.

* * * * *